United States Patent

Schnell

Patent Number: 5,847,591
Date of Patent: Dec. 8, 1998

[54] VOLTAGE DETECTION CIRCUIT AND INTERNAL VOLTAGE CLAMP CIRCUIT

[75] Inventor: Josef T. Schnell, Burlington, Vt.

[73] Assignee: Siemens Aktiengesellschaft, Munich, Germany

[21] Appl. No.: 829,256

[22] Filed: Mar. 31, 1997

[51] Int. Cl.⁶ ................................... H03K 5/08
[52] U.S. Cl. .................. 327/321; 327/54; 327/309
[58] Field of Search ................... 327/50, 54, 55, 327/57, 58, 63, 70, 77, 78, 80, 81, 309, 318, 319, 321, 327

[56] References Cited

U.S. PATENT DOCUMENTS

| | | | |
|---|---|---|---|
| 4,617,473 | 10/1986 | Bingham | 327/63 |
| 5,063,304 | 11/1991 | Iyengar | 307/296.6 |
| 5,300,824 | 4/1994 | Iyengar | 307/296.3 |
| 5,532,635 | 7/1996 | Watrous et al. | 327/310 |
| 5,561,391 | 10/1996 | Wellnitz et al. | 327/309 |
| 5,604,457 | 2/1997 | Ting | 327/321 |

*Primary Examiner*—Timothy P. Callahan
*Assistant Examiner*—Jeffrey Zweizig
*Attorney, Agent, or Firm*—Stanton C. Braden

[57] ABSTRACT

The voltage detection and control circuit includes a voltage detect circuit having an associated switch point greater than a first predetermined voltage, with the voltage detect circuit being responsive to an input voltage greater than the first predetermined voltage for generating an activation signal; and a clamp control circuit, responsive to the activation signal, for clamping an operating voltage to a second predetermined voltage. The second predetermined voltage may be substantially equal to the first predetermined voltage. A spike filter may be included for suppressing spikes in the activation signal. A clamp stage control circuit is provided for suppressing oscillations in the second predetermined voltage. At least one clamp stage, which may include a delay device, provides the operating voltage to a corresponding circuit component as well as reducing current peaks in the corresponding circuit component. The voltage detect circuit may include a current mirror, responsive to a first current generated from the input voltage, for generating a second current substantially equal to the first current for generating the activation signal.

16 Claims, 7 Drawing Sheets

VOLTAGE DETECTION CIRCUIT AND INTERNAL VOLTAGE CLAMP CIRCUIT

This disclosure relates to voltage control circuits, and in particular to a voltage detection and internal voltage clamp circuit for integrated circuits.

BACKGROUND INFORMATION

Integrated circuits, such as Dynamic Random Access Memory (DRAM) chips, generally operate using at least one predetermined voltage, typically labeled VCC or VDD, to provide operating voltages and currents to the integrated circuits and/or associated components. Typically, the predetermined voltage VCC is substantially constant; i.e. varies within a limited range, to be considered to be a voltage providing direct current (DC) characteristics.

Some DRAM designs typically have a different number of regulated internal voltages for providing power savings or for increasing wordline levels. Such internal voltages are usually regulated within a VCC window in accordance with the DC operating conditions provided by the specification of the DRAM.

A Burn In Module test is an early lifetime stress test of integrated circuit modules with specific stress conditions such as high temperature and high voltages applied to the integrated circuit over a short test time. The tests are typically performed in a Burn In chamber with a number of boards populated with integrated circuit modules; for example, greater than 100 modules/board may be tested at one time.

In order to achieve stress conditions on integrated circuits, the VCC voltage is usually increased by a factor of about 1.2 to about 1.7 over the normal operation range voltage of the integrated circuit, and so the internal voltages of the integrated circuits under test are also increased to apply the stress conditions to the integrated circuits, which typically run at the regulated voltages.

Such Burn In module testing is performed by clamping; i.e. setting, the internal voltages of an integrated circuit under test by applying a test code before a final test phase.

Heretofore, such Burn In module testing has been found to be disadvantageous, in that all the Burn In chambers have to be equipped with a control unit for controlling the setting of the internal voltages of the modules under test, which is not usually necessary for a Burn In test. In addition, heretofore the application of test codes to each individual module under test has been flawed, in that each individual module has to be guaranteed to have been set into the test mode and to remain in the test mode while burning in; i.e. for the duration of the test. Signal fluctuations during the application of the test codes may corrupt the test codes that are applied to each module under test, thus reducing the efficiency of the test. Furthermore, even if every module receives the appropriate test code and enters a test mode, signal fluctuations in the module may cause the module to exit the test mode, thus reducing the efficiency of the test.

SUMMARY

A voltage detection and control circuit is provided with a defined switch point above the normal operating conditions of an operating voltage VCC. In conjunction with a spike filter to suppress VCC noise spikes, on the order to 0.5 $\mu$s to several $\mu$s, the voltage detect circuit allows the clamping of the internal voltages to VCC for Burn In without the activation of test codes, with such clamping effected solely by increasing the VCC voltage to the Burn In stress voltage. Thus, the disadvantages of prior art Burn In testing are avoided.

A clamp device circuit is also included with the following components:

a) a clamp stage control circuit to suppress VCC oscillations caused by a voltage drop at the components under test; and b) at least one clamp stage with a delay device to reduce current peaks of the components under test.

The voltage detection and control circuit includes a voltage detect circuit having an associated switch point greater than a first predetermined voltage, with the voltage detect circuit being responsive to an input voltage greater than the first predetermined voltage for generating an activation signal; and a clamp control circuit, responsive to the activation signal, for clamping an operating voltage to a second predetermined voltage. The second predetermined voltage may be substantially equal to the first predetermined voltage. A spike filter may be included for suppressing spikes in the activation signal. A clamp stage control circuit is provided for suppressing oscillations in the second predetermined voltage. At least one clamp stage, which may include a delay device, provides the operating voltage to a corresponding circuit component and also reduces current peaks in the corresponding circuit component.

The voltage detect circuit may include a current mirror, responsive to a first current generated from the input voltage, for generating a second current substantially equal to the first current for generating the activation signal.

BRIEF DESCRIPTION OF THE DRAWINGS

The features of the disclosed voltage detection and control circuit will become more readily apparent and may be better understood by referring to the following detailed description of illustrative embodiments of the present invention, taken in conjunction with the accompanying drawings, in which.

DESCRIPTION OF THE INVENTION

Figure 1:
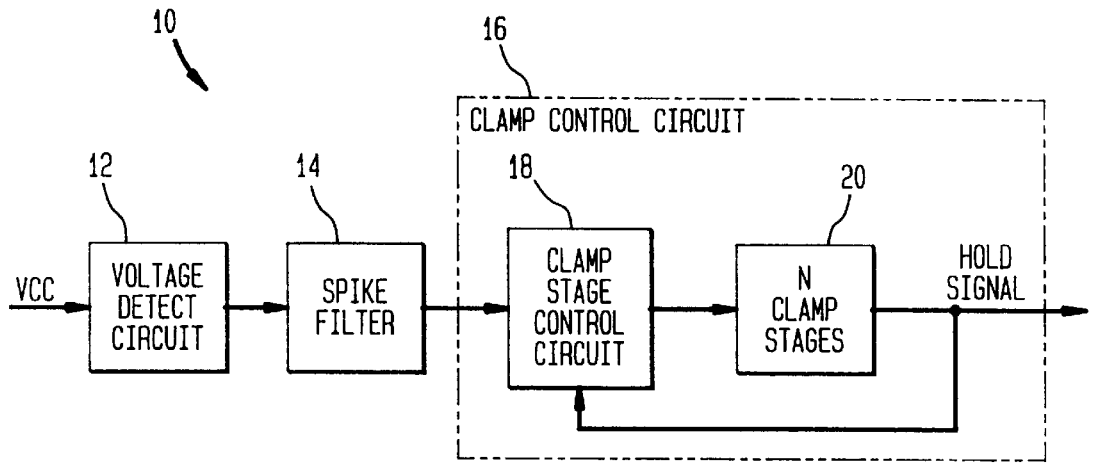
FIG. 1 is a schematic drawing of the disclosed voltage detection and control circuit.

The invention relates to voltage control circuits. In one embodiment, the voltage control circuit enables, for example, efficient and reliable testing of circuits such as during Burn In. Such voltage control circuits are useful in testing integrated circuits including DRAMs, SRAMs, and other logic devices or modules. Illustrative embodiments of the invention are described in conjunction with the drawings, with like reference numerals identifying similar or identical elements.

Referring to FIG. 1, a voltage detection and control circuit (VDCC) 10 is disclosed which includes a voltage detect circuit 12, a spike filter 14, and a clamp control circuit 16. As shown, the clamp control circuit includes a clamp stage control circuit 18 and N clamp stages 20, in which N≧1, preferably>1. The N clamp stages 20 clamp respective internal voltages of respective components, and a hold signal may be generated and fed back to the clamp stage control circuit 18 for controlling the clamping of the N clamp stages 20.

The VDCC 10 responds to an increase of an operating voltage, such as an input operating voltage VCC. Increasing the VCC is accomplished by, for example, the use of a variable voltage source (not shown in FIG. 1). In one embodiment, increasing the VCC to ≧ about a predetermined level activates a test mode of the VDCC, causing it to clamp the internal voltages of the N clamp stages 20 to a second predetermined voltage. In an illustrative embodiment, the second predetermined voltage clamped by each of the N clamp stages is substantially equal to the first predetermined voltage, such as the nominal VCC during typical operating conditions.

Figure 2:
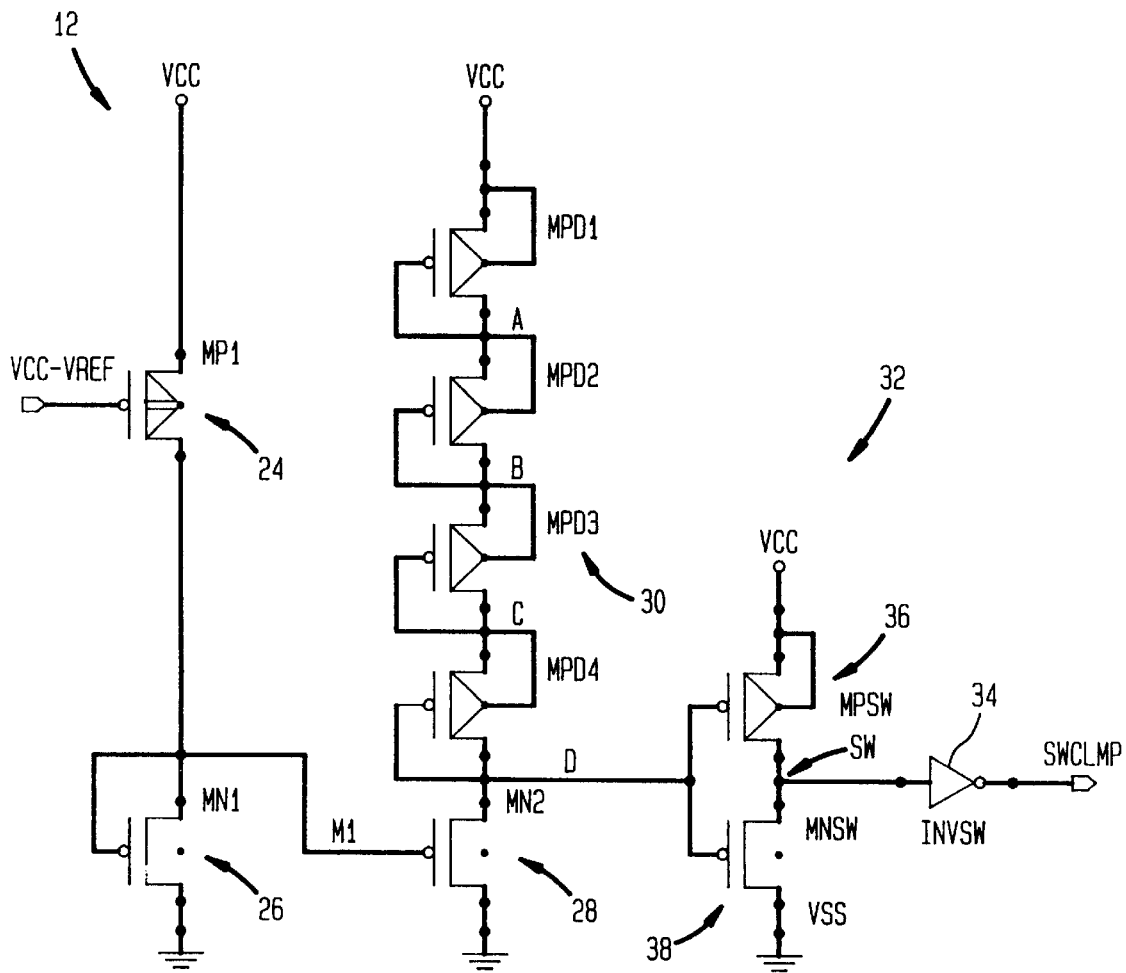
FIG. 2 is a schematic drawing of a voltage detect circuit.

FIG. 2 shows an embodiment of voltage detect circuit 12 includes the transistors 24–28, labeled MP1, MN1, and MN2, respectively. The transistors are configured as a current mirror. As shown, transistor 24 is a positive channel field effect transistor (PFET). Transistors 26 and 28 are negative channel field effect transistors (NFETs).

A set of M number of FETs, MFET 30, is connected to transistor 28. The FETs are configured as diodes. Illustratively the FETs are PFETs. In an illustrative embodiment, the input voltage corresponds to (VCC−VREF), in which VCC is the operating voltage of the integrated circuit under test, and VREF is a predetermined reference voltage. The input voltage (VCC−VREF) may be provided by a voltage source (not shown in FIG. 1), such as a resistor providing a voltage drop corresponding to VREF. Preferably, the input voltage is a regulated and temperature independent voltage which sets a first current through the transistors 24 and 26.

The input voltage (VCC−VREF) determines a current $I_A$ through transistors 24 and 26. $I_A$ is then mirrored to transistor 28, causing a voltage drop of about VREF at each of the MFETs. The total voltage drop at the node between the set of MFETs and transistor 28 is about M*VREF. The voltage at this node is then equal to about VCC−(M*VREF). Illustratively, the set of FETs comprises PFETs labeled MPD1, MPD2, MPD3, and MPD4 with corresponding nodes A, B, C, and D, respectively. The voltage drop at each of the nodes is about VREF. The total voltage drop of the set of PFETs is about (4*VREF). Accordingly, the voltage at node D is equal to about (VCC−(4*VREF).

During operation of the voltage detect circuit 12, the PFETs of transistor 24 and diodes 30 are operated in saturation, and the NFETs 26 and 28 operate at around $V_T$, the threshold voltage of each NFET.

The voltage detect circuit 12 also includes a first inverter 32 and a second inverter 34. As shown, the inverter 32 comprises a PFET 36 coupled to a NFET 38 in parallel. Inverter 32 determines the trip point or switch voltage $V_{SWL}$ of the voltage detect circuit 12. The trip point is when the input voltage is ≧ to a predetermined level, causing the detect circuit to generate an active output. For example, an input ≧ to about $V_{SWL}$ causes inverter 32 to generate an active internal SW signal. The SW signal is an active low (logic zero) signal. The active low SW signal is inverted by inverter 34, resulting in an active high (logic 1) SWCLMP signal, which is the test mode activation signal.

In an illustrative embodiment, the W/L ratio, i.e. gate-width to gate-length, for the PFET 36 is about 0.1, and the W/L ratio for the NFET 38 is about 10. During operation, if the input voltage at node D is ≧ to about the trip point, the PFET 36 is in saturation, and the NFET 38 operates at around the threshold voltage $V_T$.

As shown, $V_{SWL}$ equal to about (M*VREF)+$V_T$. Accordingly, when the input signal is ≧ to about (M*VREF)+$V_T$, the output signal SWCLMP is active, i.e. goes high, using positive logic.

During the Burn In test, the operating voltage VCC is ramped up; i.e. increased, beyond the nominal VCC (VCC$_0$). Typically, the Burn In test ramps VCC to about 1.2 to 1.7 times VCC$_0$. The ramp up of VCC, as a Burn In voltage stress condition, is typically performed at normal chip operating conditions with ambient temperatures between about 25° C. to about 85° C. Thence, the ambient temperature is increased to be greater than or equal to about 100° C., as a Burn In temperature stress condition. With increasing temperature, the trip point of the voltage detect circuit 12 typically decreases due to $DV_T$=f(T), since the threshold voltage of the NFETs, and in particular the NFET 38, varies as a function of temperature T.

An advantage of the temperature dependency of the threshold voltage $V_T$ is that it allows the trip point voltage of the voltage detect circuit 12 to be set higher during normal operating conditions (25° C.≦Temp≦85° C.) so as to increase a nominal voltage margin V1, where V1=($V_{SWL}$−VCC). A higher voltage margin V1 prevents the integrated circuit from accidentally switching into the clamp mode during normal operation.

During Burn In conditions, such as when T³100° C., the voltage margin V1 decreases since $V_{SWL}$ decreases due to $\Delta V_T$. A decrease in V1 means that the Burn In voltage margin V2 increases since V2=VCC−$V_{SWL}$. Higher V2 prevents the integrated circuit under test from exiting the clamp mode accidentally.

During the Burn In mode, the voltage detect circuit 12 operates such that, when VCC>$V_{SWL}$ and node SW of the inverter 32 is pulled down to VSS, a relatively fast voltage drop on VCC does not cause an immediate reaction of the output signal SWCLMP and at node SW due to the response time of node D. As determined from the W/L ratio of the PFET 36 and the NFET 38 as well as from the operating range of the transistor 28, the gate capacitance and the high resistive path to ground form a RC-delay with an associated time constant which acts as a filter to respond to VCC drops.

Figure 3:
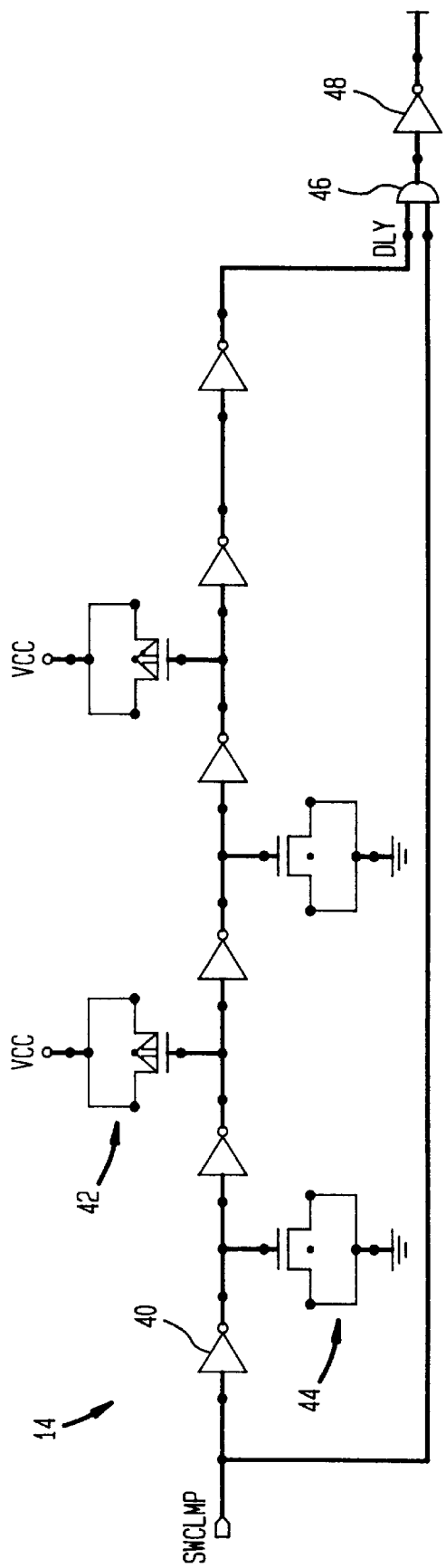
FIG. 3 is a schematic drawing of a spike filter.

FIG. 3 shows one embodiment of the spike filter 14. The spike filter 14 includes a plurality of inverters 40, a plurality of PFETs 42, and a plurality of NFETs 44 which form a delay chain to generate a delay signal DLY from the input signal SWCLMP from the voltage detect circuit 12. The input signal SWCLMP and the delay signal DLY are input to a NAND gate 46 and an inverter 48 to generate a filtered signal V_CLMP. The time of delay in generating the delay signal DLY, as determined by the length and/or components of the delay chain, determines a maximum pulse width $t_{PW}$ of input signals which are passed by the spike filter 14, and therefore the filter function of the spike filter 14 in generating the output signal V_CLMP. Accordingly, transient spikes in the input signal SWCLMP are filtered, preventing them from accidentally activating the clamping of the internal voltages, as described below.

Figure 4:
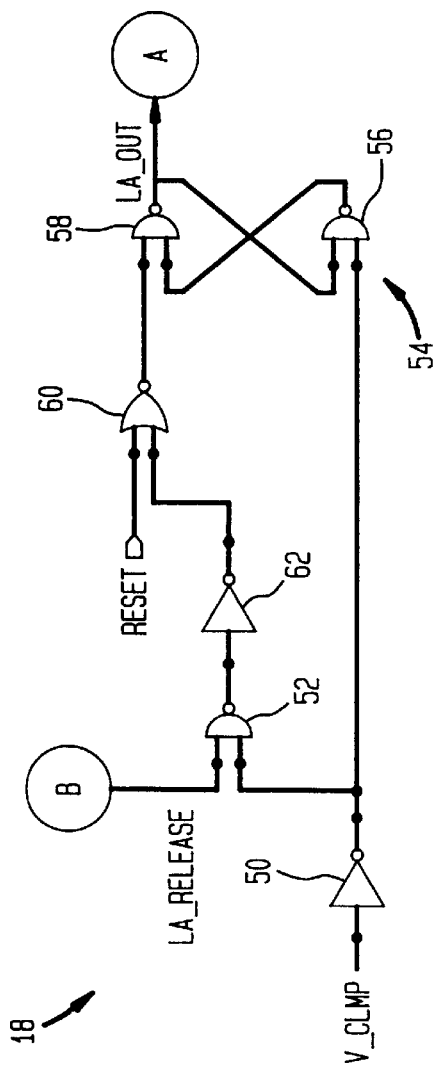
FIG. 4 is a schematic drawing of a clamp stage control circuit.
Figure 5:
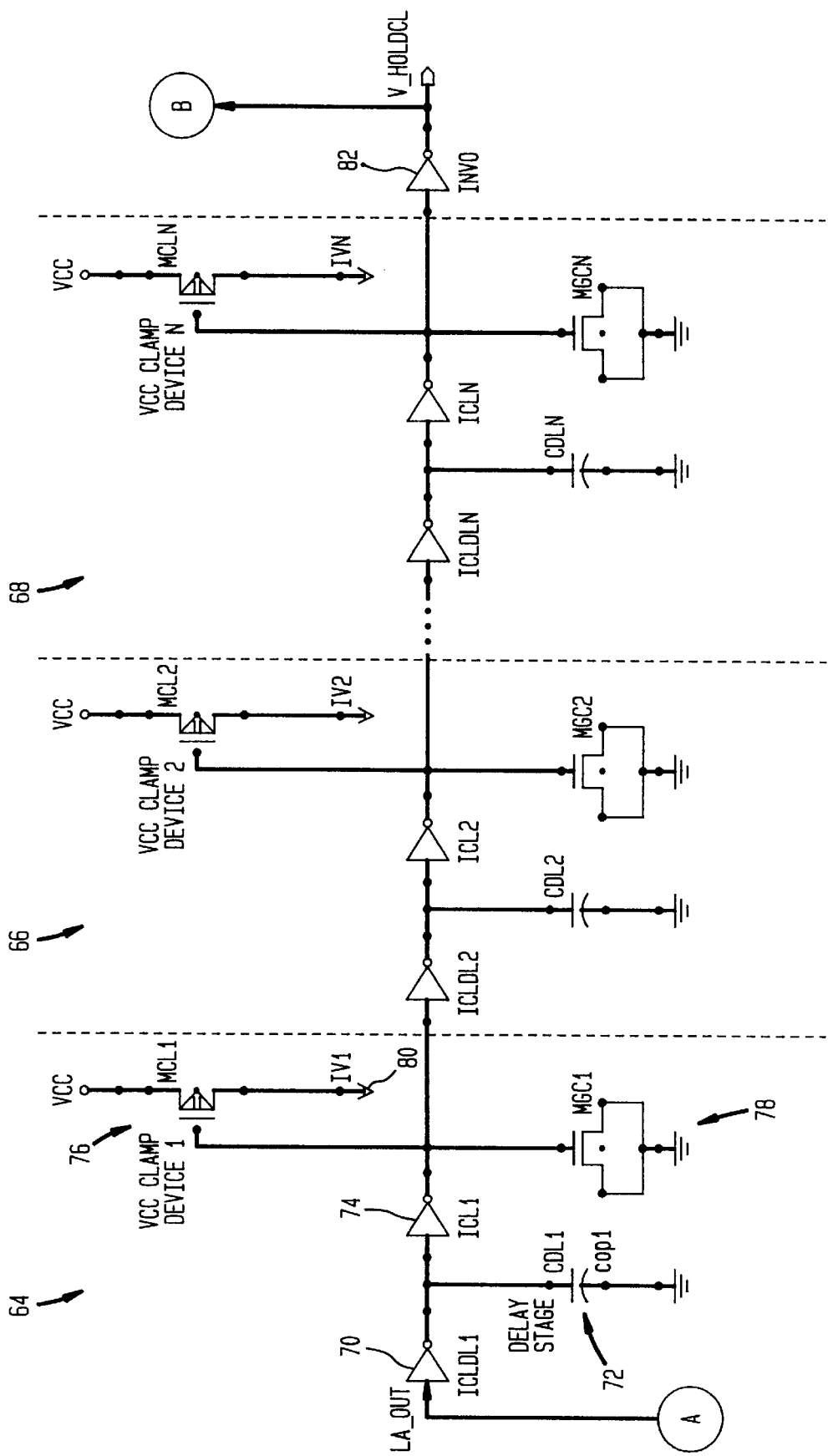
FIG. 5 is a schematic drawing of a plurality of clamp stages.
Figure 6:
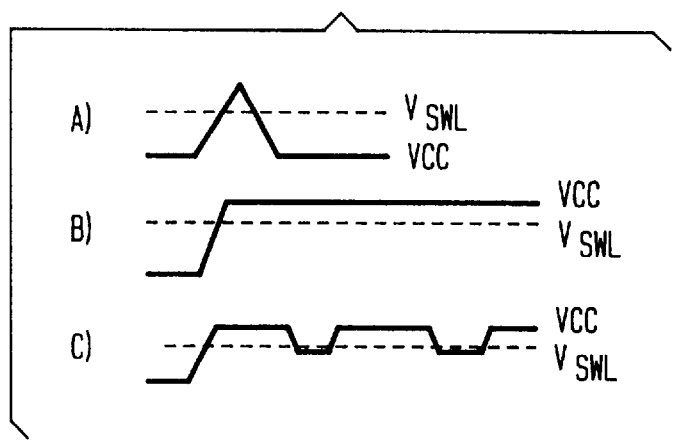
FIGS. 6–9 illustrate timing diagrams of the components of the disclosed voltage detection and control circuit.
Figure 7:
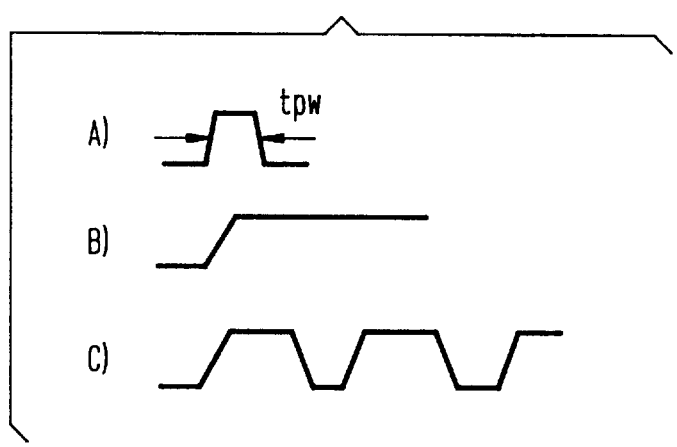
Figure 8:
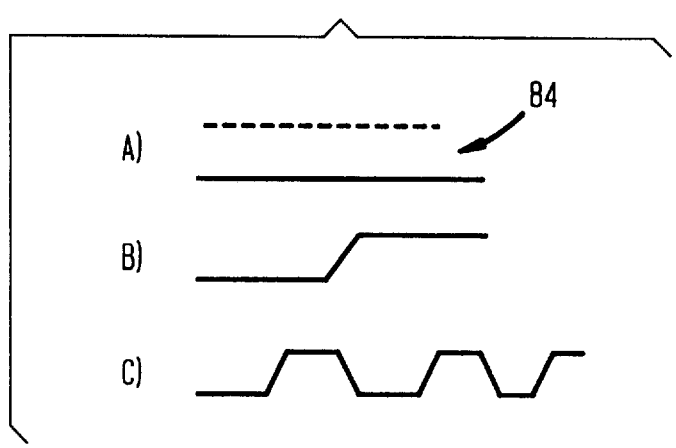
Figure 9:
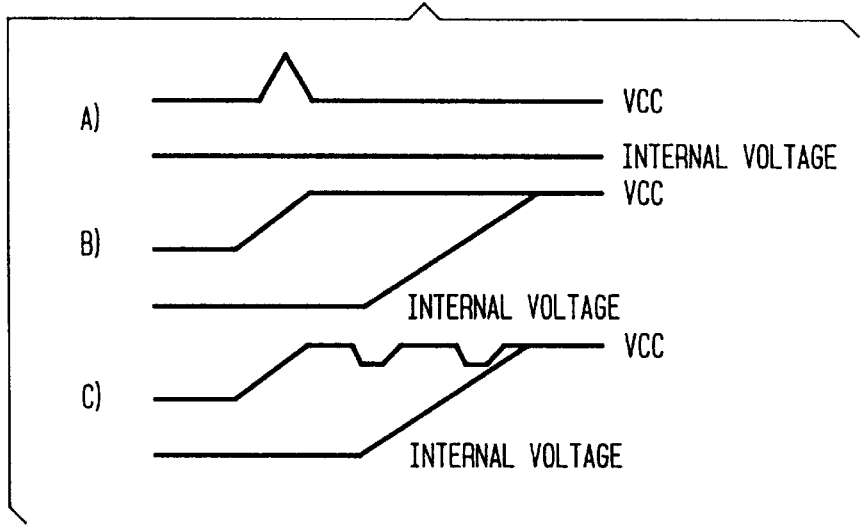

FIGS. 4–5 show an illustrative embodiment of the clamp control circuit. The clamp control circuit 16 includes a clamp stage control circuit 18 and N clamp stages 20.

Referring to FIG. 4, the clamp stage control circuit 18 comprises an inverter 50. Inverter 50 receives an input signal V_CLMP from the spike filter 14 and inverts it. The inverted signal is applied to an AND gate 52 and to a latch 54. The latch 54 includes interconnected NAND gates 56 and 58 for generating a latched signal LA_OUT. The latch 54 is set by the rising edge of V_CLMP.

The latch 54 may be reset in response to an input RESET signal applied, either manually or automatically by programming, to a NOR gate 60 and thence to the NAND gate 58 of the latch 54. Alternatively, the latch may be reset in response to an LA_RELEASE signal applied to the NAND gate 52 which NANDs the LA_RELEASE signal and the inverted V_CLMP signal, with the output of the NAND gate 52 applied to an inverter 62 and thence to the NOR gate 60. In the illustrative embodiment, the LA_RELEASE signal may be the HOLD signal output by the N clamp stages 20 as shown in FIG. 1 and described in greater detail below with reference to FIG. 5, and which is fed back to be input to the NAND gate 52 of the clamp stage control circuit 18.

In resetting the latch 54 using the LA_RELEASE signal as described above from the N clamp stages 20, the latch 54 may be reset after the last clamp stage of the N clamp stages 20 is turned on.

By using the latch 54, any oscillation of the input signal V_CLMP during the clamp phase is blocked by the clamp stage control circuit 16 from erroneously resetting the N clamp stages 20.

As shown in FIG. 5 in conjunction with FIG. 4, the N clamp stages 20 receive the output LA_OUT of the latch 54 of the clamp stage control circuit 16 as the input to the first clamp stage 64 of the N clamp stages 20, which include clamp stages 64, 66, and 68 and may be indexed from i=1 to N. Each of the clamp stages 64–68 includes a respective first inverter (ICLDLi) and a capacitor (CLDi) for providing a time delay. Each of the clamp stages 64–68 also includes a respective second inverter (ICLi) with the PFET clamp device (MCLi) and a transistor gate capacitor (MGCi), which may be an NFET. Each capacitor CDLi prevents the PFET clamp device MCLi from turning on very fast, and also reduces voltage drops in the operating voltage VCC. The activated PFET clamp device MCLi determines the voltage at node IVi, which is the internal voltage of a respective component of the integrated circuit under test.

For example, for the first clamp stage 64, a first inverter 70 and a capacitor 72 are connected to the input of the second inverter 74. The output of the second inverter 74 is connected to the input of the clamp device 76 as well as to the capacitor device 78. The activated clamp device 76 determines the internal voltage at node 80 to a first component.

Once activated by the LA_OUT signal, each clamp stage turns on one after another to clamp the internal voltages to be $VCC_0$ for a predetermined timeframe; i.e., during the Burn In test. The respective internal voltages are provided to respective nodes or inputs to respective components. The number N of stages 20 depends upon the number of nodes for clamping the internal voltages thereof. For example, for a large network of components on an integrated circuit, the number of components under test during the Burn In conditions may be relatively large, and so N is correspondingly large.

As shown in FIG. 5, the output of the $N^{TH}$ stage 68 is provided to an inverter 82 to generate an output signal V_HOLDCL, which may be fed back to the clamp stage control circuit 18 as described above with reference to FIG. 4.

FIGS. 6–10 are timing diagrams illustrating the signals applied to the voltage detect circuit 12, the spike filter 14, and the clamp control circuit 16 for different temperatures.

As shown in FIGS. 6A–6C, illustrative waveforms of the input VCC and the voltage switch point $V_{SWL}$ of the voltage detect circuit 12 are as follows:

a) a VCC spike is shown in FIG. 6A with a duration $t<t_{PW}$ μs, for example 0.5 μs, in which $t_{PW}$ is the maximum tolerable spike duration;

b) a VCC ramp up is shown in FIG. 6B such that VCC increases from $VCC_0$ to become greater than $V_{SWL}$, the voltage switch level of voltage detect circuit 12; and c) a VCC ramp up and oscillation about $V_{SWL}$ is shown in FIG. 6C.

FIGS. 7A–7C illustrate the output signal SWCLMP generated and output from the voltage detect circuit 12, corresponding to VCC as shown in FIGS. 6A–6C, respectively, as follows:

a) a spike in VCC such that $VCC>V_{SWL}$ for a duration less that $t_{PW}$ causes a pulse as the output signal SWCLMP of the voltage detect circuit 12;

b) the VCC ramp up such that VCC is greater than $V_{SWL}$, shown in FIG. 6B, causes the SWCLMP signal to go high, as shown in FIG. 7B; and c) the VCC ramp up and oscillation about $V_{SWL}$ causes the SWCLMP signal to oscillate with the pulse duration being greater than $t_{PW}$ when SWCLMP is high.

FIGS. 8A–8C illustrate the output signal V_CLMP generated and output from the spike filter 14, corresponding to SWCLMP as shown in FIGS. 7A–7C, respectively, as follows:

a) in response to the pulse in FIG. 7A generated by the spike in FIG. 6A, as long as the pulse width is less than $t_{PW}$, the output signal V_CLMP of the spike filter 14 stays low, i.e. low relative to the high logic level 84 shown in FIG. 8A, in which the time constant $t_{PW}$; i.e. maximum duration of pulse width, is adjustable by fabrication of the spike filter 14 with, for example, metal compositions or adjustable components;

b) the VCC ramp up in FIG. 6B with corresponding high signal output SWCLMP in FIG. 7B activates the generation of a high V_CLMP signal, as shown in FIG. 8B, after a predetermined delay, such as a delay corresponding to $t_{PW}$;

c) the VCC ramp up and oscillation in FIG. 6A which causes the oscillation, with high pulse durations exceeding $t_{PW}$, causes the generation of an oscillating V_CLMP signal by the spike filter 14, as shown in FIG. 8C.

FIGS. 9A–9C illustrate the clamping of internal voltages by the clamp control circuit 16 in response to the V_CLMP signal generated by the spike filter 14, corresponding to SWCLMP as shown in FIGS. 7A–7C, respectively, as follows:

a) in response to the spike in VCC shown in FIG. 6A, no clamp is active and the internal voltage is at the regulated voltage levels of the corresponding components, as shown in FIG. 9A;

b) in response to the ramp up of VCC in FIG. 6B, the internal voltages are clamped to VCC with a moderate slope; i.e. clamping occurs with a delay, caused by the clamp stage control circuit 18, to reduce the clamp current, as shown in FIG. 9B; and c) in response to the ramp up and oscillation of VCC in FIG. 6C, the clamping of the internal voltage may cause a voltage drop and probably oscillations of VCC, as shown in FIG. 9C. Therefore the N clamp stages 20 are activated with a rising V_CLMP signal having a moderate slope, with a delay caused by the clamp stage control circuit 18. The clamp stage control circuit 18 also prevents such voltage drops and oscillations by setting the latch 54 and forcing LA_OUT active high until the internal voltage equals VCC.

In use, the disclosed voltage detection and control circuit 10 may be used to clamp the internal array voltages to $VCC_0$ for Burn In tests.

Figure 10:
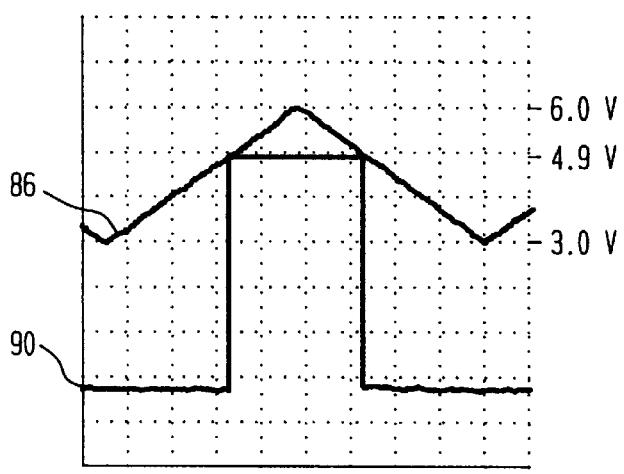
FIGS. 10–11 illustrate waveforms of variations in an operating voltage.
Figure 11:
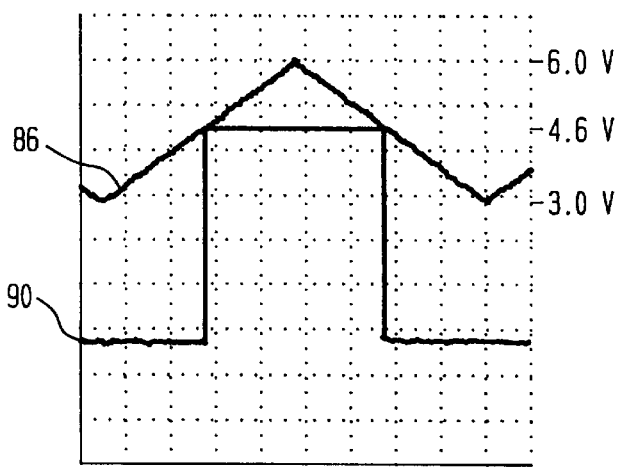

In FIGS. 10–11, a VCC ramp up/down 86 and 88 from 3 V to 6 V is shown for ambient temperatures of T=20° C. and $T^3 100°$ C., respectively. As shown in FIG. 10, the voltage switch level $V_{SWL}$, shown as 90, at the trip point of the disclosed voltage detection and control circuit 10 is about 4.9 V at low temperature; i.e. 20° C. As shown in FIG. 11, the voltage switch level $V_{SWL}$, shown as 92, decreases to 4.6 V with higher temperatures; i.e. greater than or equal about 100° C.

Figure 12:
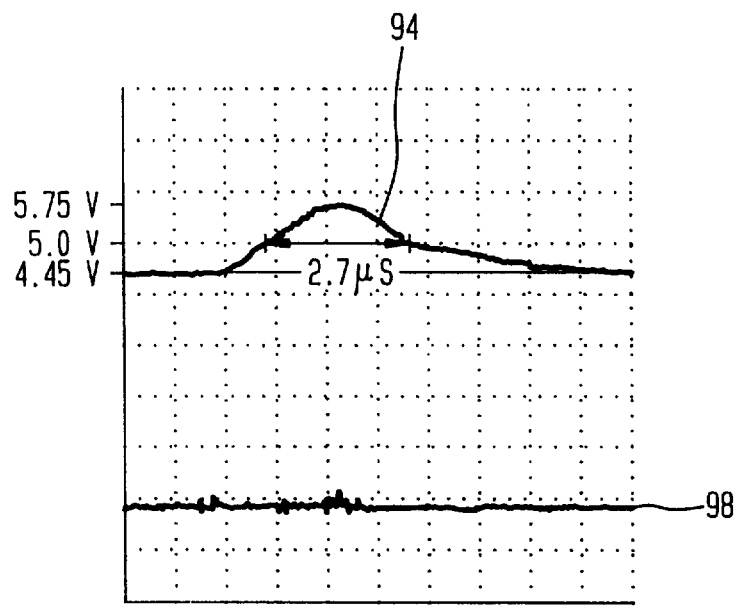
FIGS. 12–13 illustrate waveforms of a filter function for filtering spikes.
Figure 13:
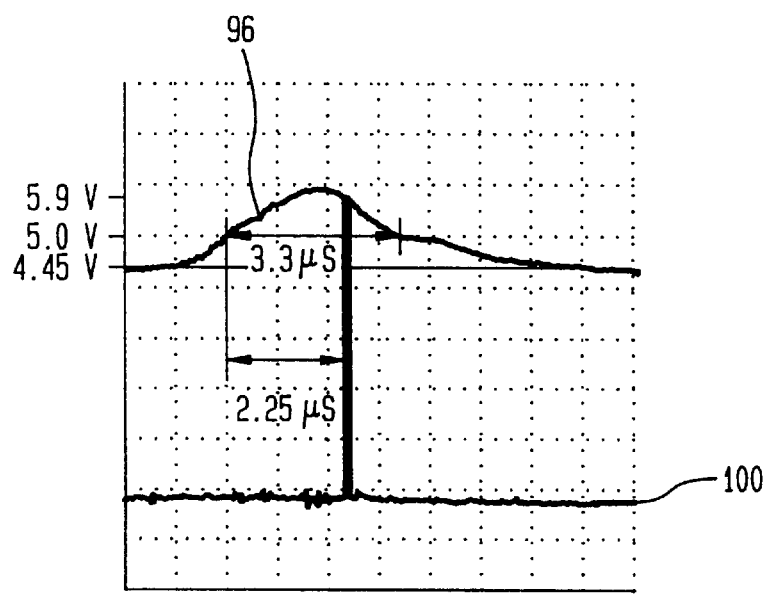

In FIGS. 12–13, spikes 94 and 96 from 4.4 V to about 5.75 V and to about 5.9 V, respectively, at T=20° C. are shown with different pulse widths, as a relatively fast VCC spike on the order of about 1 V/1 μs. As shown in FIG. 12, the spike 94 has a pulse width $t_{PW}$ of about 2.7 μs wide, and the V_CLMP signal, shown as 98, does not become active. As shown in FIG. 13, the pulse width $t_{PW}$ of the spike 96 is relatively wider at about 3.3 μs, and the V_CLMP signal 100 switches on and off, with activation after about 2.25 μs.

Figure 14:
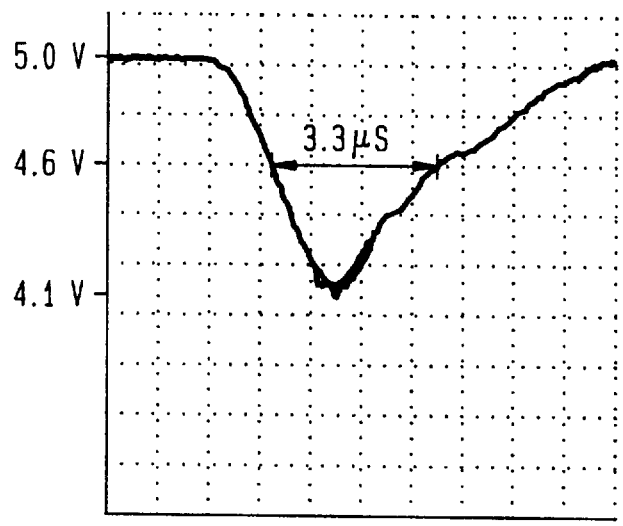
FIGS. 14–15 illustrate waveforms of the operation of the disclosed voltage detection and control circuit.
Figure 15:
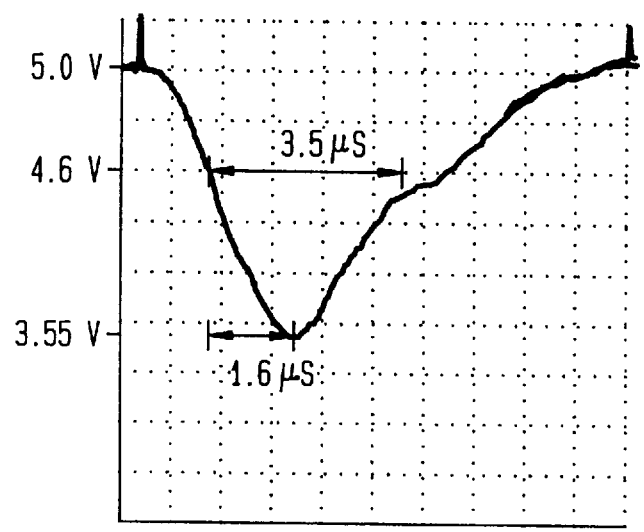

Referring to FIGS. 14–15, illustrative waveforms are shown which demonstrate the behavior of the voltage detection and control circuit 10 under Burn In conditions with high voltage and temperature; i.e. increased VCC and an ambient temperature of greater than or equal about 100° C., in which VCC has been increased to be above $V_{SWL}$, and so the SWCLMP signal is high. If a voltage drop occurs in VCC as shown in FIG. 14, for example by an oscillation as in FIG. 6C, such that VCC is less than $V_{SWL}$, such as 4.6 V at $T^3 100°$ C., if the duration of such a voltage drop occurs for a short time but recovers very fast, such as with a duration of the voltage drop of less than about 3.3 μs, the output signal SWCLMP of the voltage detect circuit 12 stays high, such as illustrated in FIG. 7B. As shown in FIG. 15, if the voltage drop has a duration longer than about 3.9 μs, the output signal SWCLMP switches off and on as shown in FIG. 7C. Accordingly, insignificant fluctuations in VCC; i.e. fluctuations such as oscillations lasting less than a predetermined duration, do not de-clamp the clamped internal voltages set by the N clamp stages 20.

While the disclosed voltage detection and control circuit 10 and method of use have been particularly shown and described with reference to the specific embodiments, it is understood by those skilled in the art that various modifications in form and detail may be made therein without departing from the scope of the invention. Merely by way of example, the diodes can be implemented with NFETs instead of PFETs. Therefore, the scope of the invention should be determined not with reference to the above description but with reference to the appended claims along with their full scope of equivalents.

What is claimed is:

1. A voltage control circuit comprising:

a voltage detect circuit having an associated switch point greater than a first predetermined voltage, the voltage detect circuit responsive to an input voltage greater than the first predetermined voltage for generating an activation signal;

a spike filter for suppressing spikes in the activation signal; and a clamp control circuit, responsive to the activation signal, for clamping an operating voltage to the input voltage.

2. The voltage control circuit of claim 1 wherein the clamp control circuit further includes:

a clamp stage control circuit for suppressing oscillations in the second predetermined voltage.

3. The voltage control circuit of claim 1 wherein the clamp control circuit further includes:

at least one clamp stage for providing the operating voltage to a corresponding circuit component.

4. The voltage control circuit of claim 3 wherein the at least one clamp stage includes a delay device.

5. The voltage control circuit of claim 1 wherein the at least one clamp stage reduces current peaks in the corresponding circuit component.

6. The voltage control circuit of claim 1 wherein the voltage detect circuit further includes:

a current mirror, responsive to a first current generated from the input voltage, for generating a second current substantially equal to the first current for generating the activation signal.

7. A voltage control circuit comprising:

a voltage detect circuit having a first state and a second state, the voltage detect circuit responsive to a input voltage greater than a predetermined voltage $VCC_0$ for switching from the first state to the second state to generate an activation signal;

a spike filter for suppressing spikes in the activation signal; and a clamp control circuit, responsive to the activation signal, for clamping an operating voltage to the input voltage.

8. The voltage control circuit of claim 7 wherein the clamp control circuit further includes:

a clamp stage control circuit for suppressing oscillations in the operating voltage.

9. The voltage control circuit of claim 7 wherein the clamp control circuit further includes:

at least one clamp stage for providing the operating voltage to a corresponding circuit component.

10. The voltage control circuit of claim 7 wherein the at least one clamp stage reduces current peaks in the corresponding circuit component.

11. The voltage control circuit of claim 10 wherein the at least one clamp stage includes a delay device.

12. The voltage control circuit of claim 7 wherein the voltage detect circuit further includes:

a current mirror, responsive to a first current generated from the input voltage, for generating a second current substantially equal to the first current for generating the activation signal.

13. A method for controlling voltages comprising the steps of:

receiving an input voltage;

detecting a condition of the input voltage being greater than a first predetermined voltage;

generating an activation signal if the input voltage is greater than the first predetermined voltage;

filtering the activation signal; and clamping an operating voltage to a second predetermined voltage in response to the activation signal.

14. The method of claim 13 wherein the step of clamping the operating voltage includes the step of:

clamping the operating voltage to the input voltage being substantially equal to the first predetermined voltage.

15. The method of claim 13 further comprising the step of:

suppressing oscillations in the second predetermined voltage.

16. The method of claim 13 wherein the step of generating the activation signal further includes the steps of:

generating a first current from the input voltage;

generating a second current substantially equal to the first current using a current mirror; and generating the activation signal from the second current.

* * * * *